(12) United States Patent
Shenoy et al.

(10) Patent No.: US 10,910,957 B1
(45) Date of Patent: Feb. 2, 2021

(54) SILICON CARBIDE POWER INVERTER/RECTIFIER FOR ELECTRIC MACHINES

(71) Applicant: Calnetix Technologies, LLC, Cerritos, CA (US)

(72) Inventors: Suratkal P. Shenoy, Cerritos, CA (US); Jinsheng Wei, Cerritos, CA (US); Octavio Solis, Cerritos, CA (US)

(73) Assignee: Calnetix Technologies, LLC, Cerritos, CA (US)

( * ) Notice: Subject to any disclaimer, the term of this patent is extended or adjusted under 35 U.S.C. 154(b) by 0 days.

(21) Appl. No.: 16/597,650

(22) Filed: Oct. 9, 2019

(51) Int. Cl.
| | |
|---|---|
| *H02M 7/00* | (2006.01) |
| *H02M 7/797* | (2006.01) |
| *H02P 27/08* | (2006.01) |
| *H02P 9/30* | (2006.01) |
| *H02H 7/122* | (2006.01) |
| *H02M 1/12* | (2006.01) |
| *H01L 25/16* | (2006.01) |
| *H01L 23/492* | (2006.01) |

(52) U.S. Cl.
CPC .......... *H02M 7/797* (2013.01); *H01L 23/492* (2013.01); *H01L 25/16* (2013.01); *H02H 7/1225* (2013.01); *H02M 1/12* (2013.01); *H02M 7/003* (2013.01); *H02P 9/305* (2013.01); *H02P 27/08* (2013.01)

(58) Field of Classification Search
CPC ........ H02M 3/073; H02M 3/10; H02M 3/135; H02M 3/137; H02M 3/28; H02M 3/315; H02M 7/10; H02M 7/515
See application file for complete search history.

(56) References Cited

U.S. PATENT DOCUMENTS

| | | | |
|---|---|---|---|
| 9,797,212 B2 | 10/2017 | Kraemer et al. | |
| 10,110,114 B2 | 10/2018 | MacLennan | |
| 10,211,800 B2 | 2/2019 | Wennerstrom et al. | |
| 2016/0204689 A1 | 7/2016 | Wennerstrom et al. | |
| 2019/0238062 A1* | 8/2019 | Lu | H01L 29/7393 |

OTHER PUBLICATIONS

Sabri et al., (New Generation 6.5 kV SiC Power MOSFET, 2017 IEEE 5th Workshop on Wide-Bandgap Power Devices and Applications (WiPDA), 2017, p. 246-250, 9 refs. ISBN: 978-1-5386-3117-1). (Year: 2017).*
Shenoy et al, "Commercializing Medium Voltage VFD that Utilizes High Voltage SiC Technology," Calnetix, 2017 International Workshop on Integrated Power Packing (IWIPP), 4 pages.

* cited by examiner

*Primary Examiner* — Adolf D Berhane
*Assistant Examiner* — Afework S Demisse (57) ABSTRACT

The present disclosure involves a two stage inverter, a system for electrical power conversation, and a method of converting electrical power using silicon carbide (SiC) metal-oxide-semiconductor field-effect transistors (MOSFETs). One example implementation includes using two or more SiC MOSFETs in series with each MOSFET having a gate terminal for triggering a state switch between an on (conducting) and off (non-conducting) state of the MOSFET. An AC terminal is connected between the series SiC MOSFETS, and the series SiC MOSFETs are connected across a DC bus and in parallel with one or more capacitors.

20 Claims, 7 Drawing Sheets

SILICON CARBIDE POWER INVERTER/RECTIFIER FOR ELECTRIC MACHINES

This invention was made with Government support under Contract No. DE-EE0007251 awarded by the United States Department of Energy. The Government has certain rights in this invention.

TECHNICAL FIELD

This disclosure generally relates to inverting power for driving an electric motor and for conditioning power from a generator.

BACKGROUND

Modern electrical machines and electrical distribution grids use a combination of direct current (DC) and alternating current (AC) power. For example, many energy generation and storage techniques such as solar power, or batteries, use DC power, while many motors or machines are AC machines. Therefore it is desirable to have an efficient, reliable, and simple means of conversion from AC to DC or DC to AC, especially as power increases, and losses or inefficiencies also increase.

SUMMARY

In general, the disclosure involves a two stage inverter, a system for electrical power conversation, and a method of converting electrical power using silicon carbide (SiC) metal-oxide-semiconductor field-effect transistors (MOSFETs). One example implementation includes using two or more SiC MOSFETs in series with each MOSFET having a gate terminal for triggering a state switch between an on (conducting) and off (non-conducting) state of the MOSFET. An AC terminal is connected between the series SiC MOSFETS, and the series SiC MOSFETs are connected across a DC bus and in parallel with one or more capacitors.

Implementations can optionally include one or more of the following features.

In some implementations, the DC bus has a voltage of 3,000V or greater, and each SiC MOSFET includes a drain terminal and a source terminal, and is rated for a drain to source voltage of at least 10,000V.

In some instances, the SiC MOSFETs are capable of switching states between an on (conducting) and off (non-conducting) state at a frequency of greater than 5 kHz In some instances, the DC bus includes a positive and negative conducting plate that form two conducting paths, and the two conducting paths follow the same shape. The DC bus can include an insulated coating on a portion of each conducting plate. The insulated coating can be a powder coating. In some implementations, the conducting plates are shaped such that they nest together, minimizing a distance between the conducting paths.

In some implementations, the inverter includes a shoot-through protective circuit including a current sensor, such as a current transformer that is inductively coupled to at least one capacitor in parallel with the SiC MOSFETs, a comparator that compares an output signal generated by the current sensor with a reference signal, and a latch that interrupts gating signals being sent to the SiC MOSFETs and places the SiC MOSFETs in an off state.

In some instances, the at least one capacitor in parallel with the SiC MOSFETs is a capacitor bank including at least two sets of series capacitors, each set having a positive end, an negative end, and an intermediate node. The capacitor bank can further include a center tap that conductively connects the intermediate nodes of the two or more sets of series capacitors.

In some instances, the SiC MOSFETs are positioned in between two sets of capacitors, each set of capacitors connected in series with a positive end and a negative end.

The details of one or more implementations of the subject matter of this specification are set forth in the accompanying drawings and the description below. Other features, aspects, and advantages of the subject matter will become apparent from the description, the drawings, and the claims.

DESCRIPTION OF DRAWINGS

To describe technical solutions in the implementations of the present specification or in the existing technology more clearly, the following briefly describes the accompanying drawings needed for describing the implementations or the existing technology. Apparently, the accompanying drawings in the following descriptions merely show some implementations of the present specification, and a person of ordinary skill in the art can still derive other drawings from these accompanying drawings without creative efforts.

Like reference numbers and designations in the various drawings indicate like elements.

DETAILED DESCRIPTION

This disclosure describes a bidirectional power inverter (inverter/rectifier) for an electric machine, i.e. electric motor and/or electric generator, designed to generate or convert medium voltage alternating current (AC) power using a two stage, medium voltage, silicon carbide (SiC) metal-oxide-semiconductor field-effect transistor (MOSFET) arrangement. The inverter uses SiC MOSFETS which are able to achieve a comparably high voltage and power throughput, and high frequency, high efficiency state switches. The SiC MOSFETS can be arranged in a two level configuration, which reduces the overall system complexity, and allows for high switching frequencies. The bidirectional inverter can be used as a motor driver, an active rectifier for controlling power generated by an electric generator or both a driver and rectifier for an electric machine capable of both motoring and generating. Without limitation, in some implementations the bidirectional inverter can be used solely as an inverter, or solely as an active rectifier.

By using a two level configuration, complex capacitor balancing and DC voltage isolation is not required as compared to a multi-level inverter. Additionally a single gate driver board can be used for the entire inverter module because there are fewer regions requiring voltage isolation when compared to a traditional multi-level inverter.

Due to the nature of SiC MOSFETS with SiC body diodes, the diodes can recover orders of magnitude faster than traditional silicon MOSFETS, therefore a time rate of change of the recovery current (di/dt) can be large. This in combination with a high switching frequency and high power can result in large voltage overshoots across the MOSFET if the leakage inductance of the positive and negative direct current (DC) busses are not minimized. Therefore this present disclosure discusses a system for minimizing leakage inductance of the DC bus in a two stage SiC MOSFET inverter.

An additional feature, optionally combinable with any other feature disclosed herein, is an independent shoot-through protection circuit. Typical shoot-through protective circuits in a MOSFET are designed as part of the gate driver, and ensure a series pair of MOSFETS are not gated simultaneously. A gate driver failure, however, can result in a loss of shoot-through protection, and potentially damage the system. Therefore it is desirable to have an independent circuit, which can monitor a shoot-through condition and prevent the current from reaching destructive level in the event of a gate driver failure. This is particularly important in the high voltage application disclosed herein, where there can be a single pair of MOSFETs across large DC voltages (e.g., 6.5 kV). An advantage of the independent shoot-through protection circuit is that it can provide signals to shut off the MOSFETs in the event of shoot-through, prior to the MO SFETs desaturation.

To help a person skilled in the art better understand the technical solutions in the present specification, the following clearly and comprehensively describes the technical solutions in the implementations of the present specification with reference to the accompanying drawings in the implementations of the present specification. Apparently, the described implementations are merely some rather than all of the implementations of the present specification. All other implementations obtained by a person of ordinary skill in the art based on one or more implementations of the present specification without creative efforts shall fall within the protection scope of the implementations of the present specification.

Figure 1A:
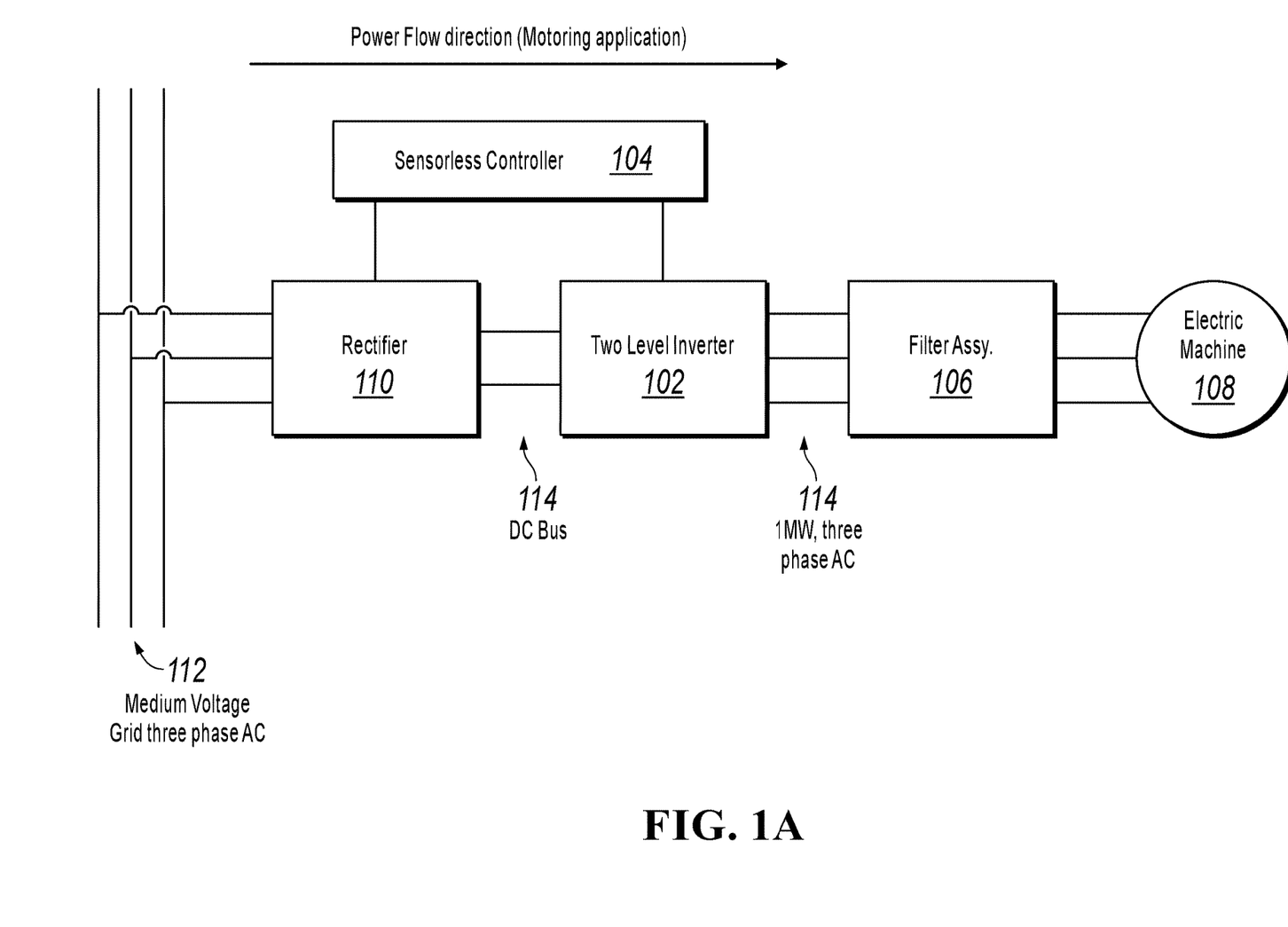
FIG. 1A depicts a system for driving an electric machine, using a two level inverter.
Figure 1B:
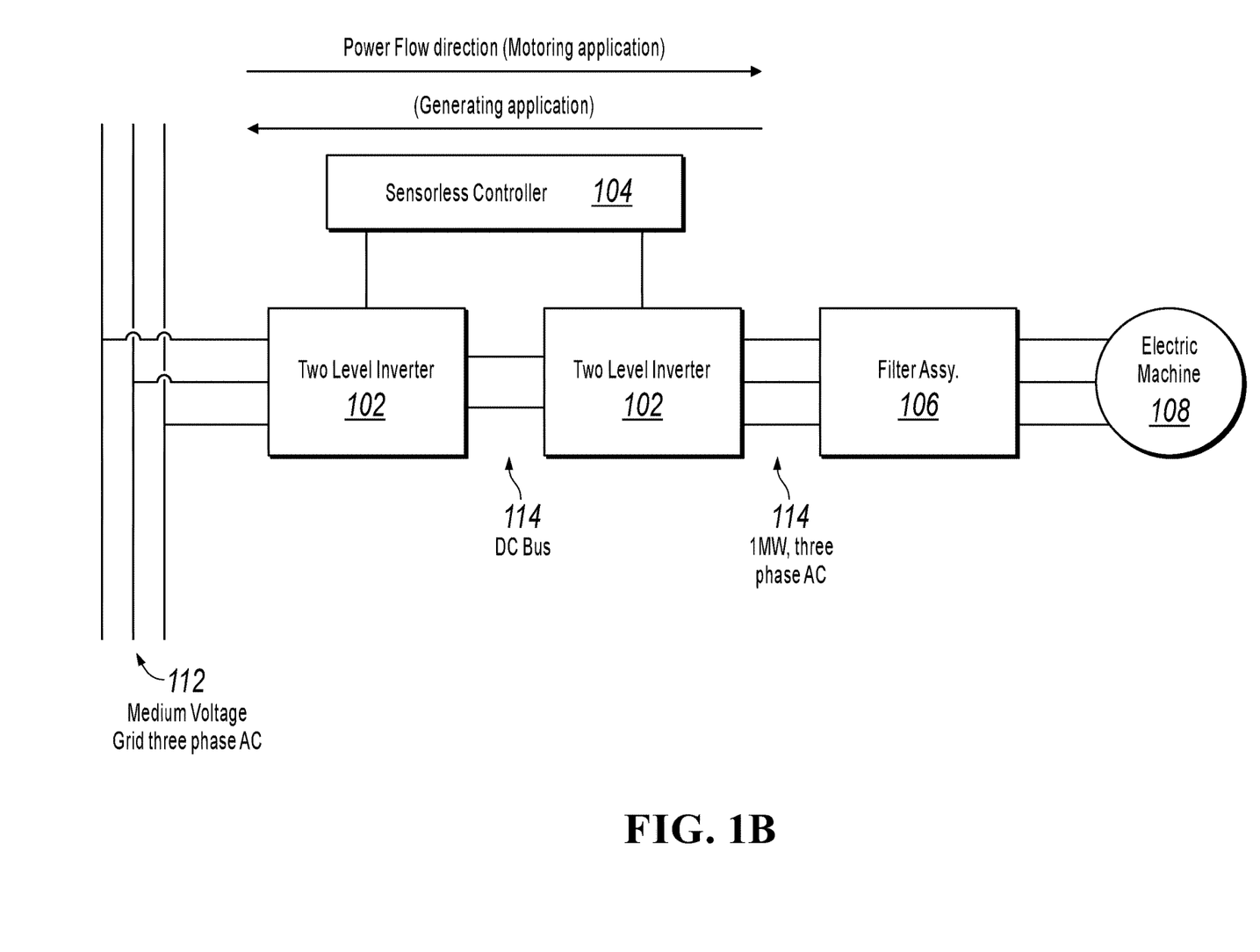
FIG. 1B depicts a system for generating power from an electric machine, using a two level inverter.

FIGS. 1A and 1B depict an example system using a two level bidirectional inverter. As a motor driver, the two-level inverter 102 receives DC power from the DC bus bar assembly 114. The DC power is converted into AC using SiC MOSFETs, switched using pulse-width modulation (PWM) in order to simulate a sinusoidal AC output. The simulated AC output can be filtered using a filter assembly 106, which can be passive components, for example, an array of inductors, to create the desired AC output. The AC output is then supplied to an electric machine 108. The electric machine 108 can be an electric motor, a generator or a motor/generator. The DC bus bar assembly 114 can be powered from a passive rectifier 110 (FIG. 1A) or an active rectifier, for motoring application which takes AC power from a source supply 112 and converts it to DC. In an alternative implementation, the DC bus bar assembly 114 can be supplied from a battery, capacitor bank, or solar panels, among other things. The DC bus bar assembly 114 can also have any combination of the previously mentioned supplies. The DC bus bar assembly 114 can be a medium voltage bus, for example, the voltage between the positive and negative terminals of the DC bus bar assembly 114 can be greater than 3,000V. A sensorless controller 104 can supply gating signals to SiC MOSFET gate drivers in the two level inverter 102. The sensorless controller 104 can also supply gating signals to a rectifier 110. For a generating application (FIG. 1B) the motor power is rectified by the two level inverter 102 acting as an active rectifier which powers the DC bus bar assembly 114. The DC power is then converted to synchronized AC by a second two level inverter 102 operating as an inverter and fed back to the Medium voltage AC grid.

The filter assembly 106 can be designed using, for example, an array of inductors, or an array of inductors and capacitors. The filter assembly 106 can act as a low-pass filter, and filter out switching harmonics caused by PWM. In another implementation, the filter assembly 106 can be a band-pass filter that is tuned to provide a desired frequency to the electric machine 108. The filter assembly 106 can include passive or active components, the present solution is not limiting thereto.

In some instances, the two level inverter 102 can be configured to supply three phase AC to the filter assembly 106. In other instances, only single phase AC is provided. In yet another example, additional phases may be generated. The two level inverter 102 contains modules (discussed in further detail in reference to FIG. 2) that can be implemented in various numbers to achieve the desired number of phases at the system output.

The two level inverter 102 includes SiC MOSFETs, which can withstand medium voltage (for example, 3300V to 13,000V) drain to source voltage. In one implementation, the SiC MOSFETs can be rated for 10 Kv drain to source voltage. The SiC MOSFETS are also capable of high frequency switching operations (for example, 5 kHz) and have low switching losses. Higher voltages are achievable if additional MOSFETs are connected in series. In one implementation, the two level inverter 102 uses three modules (as discussed with reference to FIG. 2) to achieve an approximately 1MW (334 KW for each of three phases) power capacity at 4160 V AC at the output. In another example, three pairs of modules (six total) can be configured with the pairs in series to achieve approximately 2MW of power capacity at 8320 V AC at the output (see FIG. 6).

Figure 2:
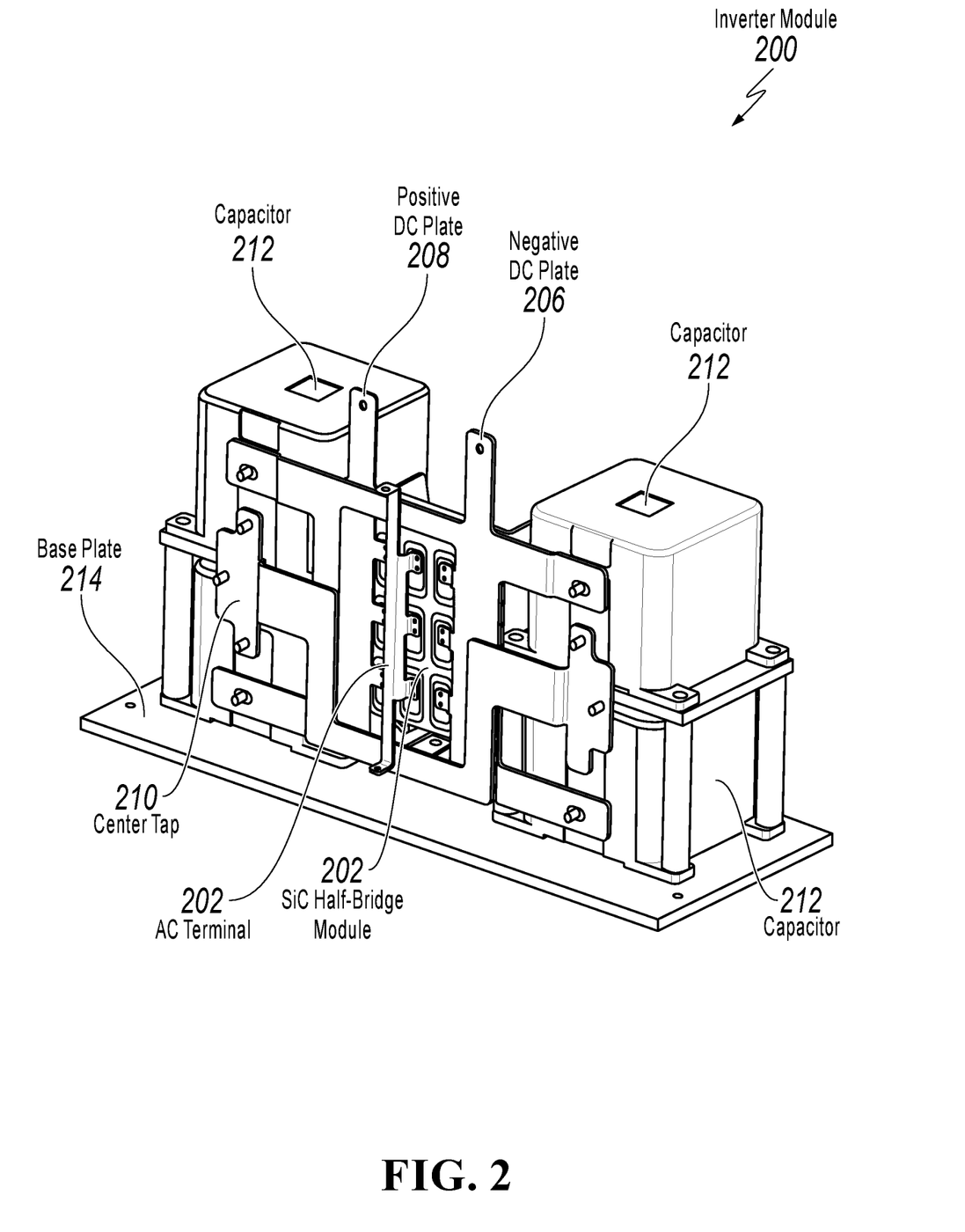
FIG. 2 depicts a perspective view of a two level bidirectional inverter module.

FIG. 2 depicts a perspective view of a two level inverter module 200. The two level inverter 102 can include any number of inverter modules 200. For example, a system that produces three phase AC power might have three inverter modules 200, one that produces each phase. In another example, for a higher power output, there may be six inverter modules 200. In this example, there may be two modules for each of three phases of power. In yet another example, if six phase AC power is desired, six inverter modules 200 could be used, one for each phase. One of ordinary skill in the art can readily determine that any suitable combination of modules can be used, either in series or parallel, to achieve desired AC output properties.

A SiC half-bridge module 202 can be positioned near the center of the inverter module 200. The SiC half-bridge module 202 can contain multiple SiC MOSFETs, as shown in FIG. 2 the module contains six SiC MOSFETs, which allows for an increased current rating, operating in three parallel pairs. In another example, there can be two SiC MOSFETs, or eight, among other things. The present disclosure is not limiting thereto. The SiC half-bridge module 202 can be configured to be switched at high frequency, with each SiC MOSFET switching state at a frequency of, for example, greater than 5 kHz.

The SiC half-bridge module 202 can be flanked on either side by DC bus capacitors 212 (four depicted). In the present implementation, four DC bus capacitors 212 are shown. In another implementation, two capacitors can be used, or six, or more. Each SiC half-bridge module 202 in the two level inverter 102 can have its own DC bus capacitors 212. By placing the SiC half-bridge module 202 in between the DC bus capacitors 212 the distance between the SiC half-bridge module 202 and each capacitor terminal is reduced. This reduced distance results in a compact design, and creates shorter DC current connection, which reduces the DC bus inductance. Additionally this configuration reduces the loop inductance of the DC bus bar assembly 114 shown in greater detail below with reference to FIG. 4.

The DC bus bar assembly 114 has a positive DC bus plate 208 and a negative DC bus plate 206. These two plates supply DC power to the SiC half-bridge module 202. The DC bus bar assembly 114 is discussed in greater detail below, and in reference to FIG. 4. In one implementation, where multiple DC bus capacitors 212 are connected in series, one or more center tap 210 may be desired to equalize the intermediate voltage between sets of DC bus capacitors 212.

The AC terminal 204 is connected between the SiC MOSFET pairs in the SiC half-bridge module 202. The AC terminal 204 can act as the system output, where AC current is drawn from the DC bus bar assembly 114 through the inverter module 200. Alternatively the AC terminal 204, can be the system input, and supply the DC bus bar assembly 114 via the inverter module 200. The AC terminal 204 can be a motor terminal, powering an AC motor. In another implementation, the AC terminal 204 is supplied by an AC generator, or a motor/generator machine.

The SiC half-bridge module 202, capacitors 212, plates 206, 208 and center tap 210 can collectively be affixed to a common base plate 214 so that the inverter module 200 is modularized, physically arranged as a single unit.

Figure 3:
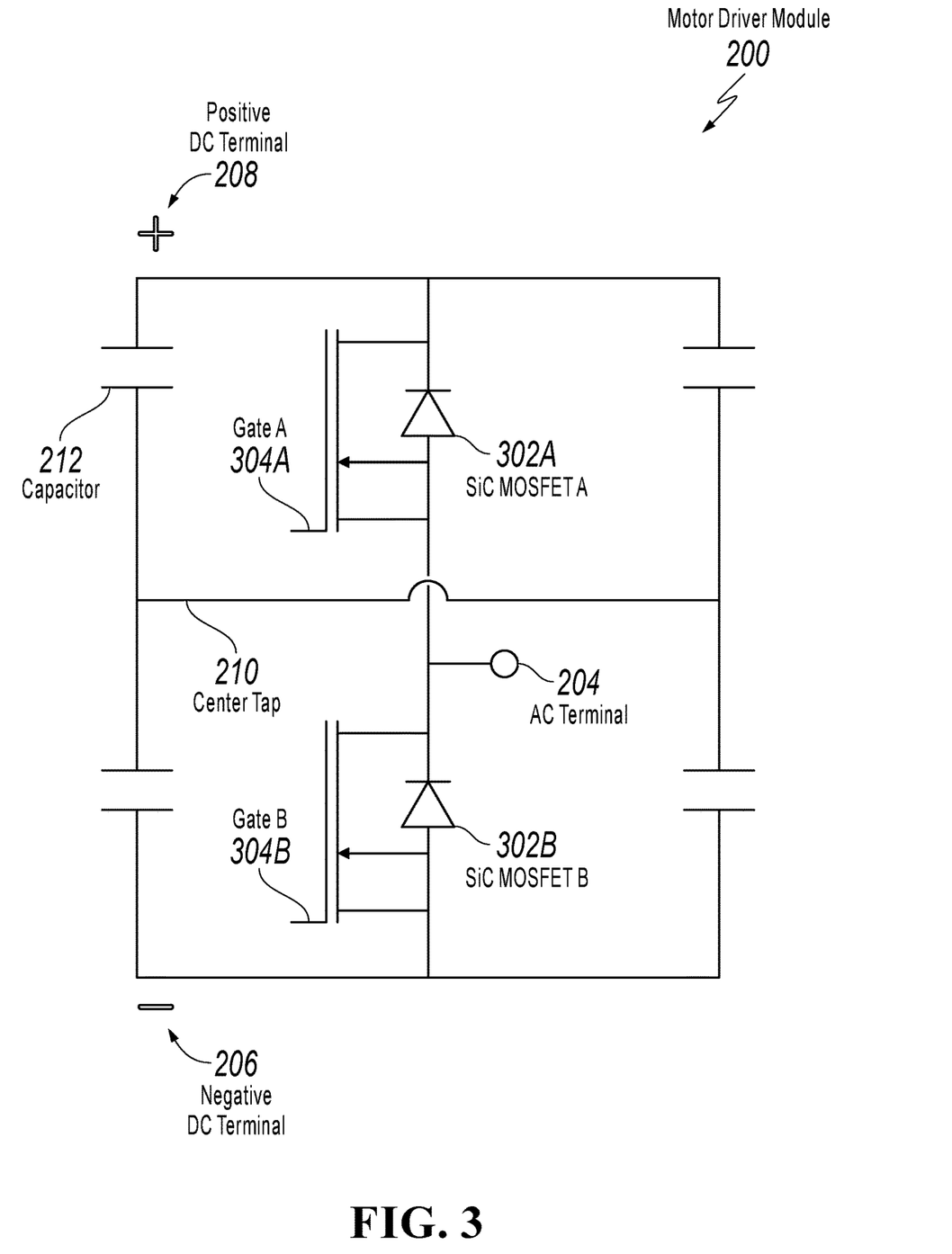
FIG. 3 is a simplified electrical schematic diagram of a bidirectional inverter module.

FIG. 3 is a simplified electrical schematic diagram of an inverter module. This schematic shows an example of how a two-level bidirectional inverter can be configured. Two SiC MOSFETs (302A and 302B) are shown, in series. When the AC terminal 204 is in a positive phase, SiC MOSFET A (302A) is gated on via a gating signal delivered at gate "A" (304A). The amplitude of the voltage at the AC terminal 204 can be controlled using PWM switching of SiC MOSFET A (302A). Likewise, during a negative phase at the AC terminal 204, SiC MOSFET B (302B) is switched using a PWM signal at gate "B" (304B).

It is desirable to ensure that SiC MOSFET A (302A) and SiC MOSFET B (302B) are not simultaneously in a conducting state for a significant amount of time. If this occurs, a large current can flow across the capacitor 212 and potentially cause damage. This is known as shoot-through.

Because SiC MOSFETs can be switched more quickly than their conventional Si counterparts, they can produce very large time rate of change recovery currents (recovery current change: di/dt). These large recovery currents can cause large voltage spikes between drain and source of the SiC MOSFETs following switching events. The magnitude of the voltage spikes will depend in part on the inductance of the DC bus bar assembly 114, therefore it is desirable to have a DC bus bar assembly 114 configured to have a minimum inductance.

Figure 4:
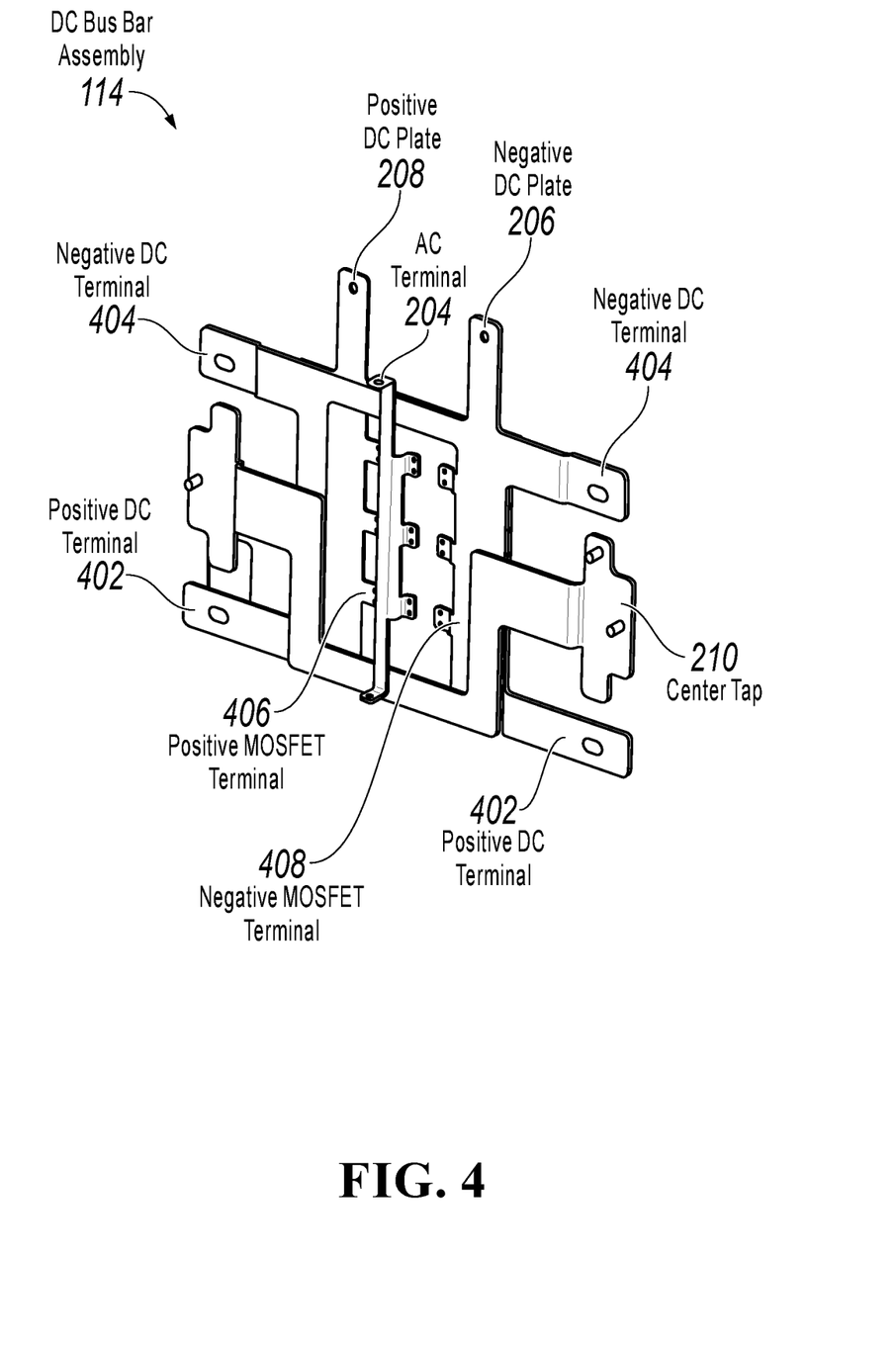
FIG. 4 depicts a perspective view of a low inductance DC bus for a two level bidirectional inverter.

FIG. 4 depicts a perspective view of a low inductance DC bus bar assembly 114 for a two level bidirectional inverter. In this implementation, the DC bus bar assembly 114 has a positive DC bus plate 208, with two positive DC terminals 402. The positive DC terminals 402 are configured to be electrically connected to the positive end of the DC bus capacitor 212, or series of DC bus capacitors (as shown in FIG. 2). The negative plate 404 is similarly configured to be electrically connected to the negative end of the DC bus capacitor 212, or series of DC bus capacitors (as shown in FIG. 2). In one implementation, the negative DC bus plate 206 and positive DC bus plate 208 can be symmetrical, or nearly symmetrical across the SiC half-bridge module 202, so that the electrical conductive paths of each plate 206, 208, but for their respective terminals, are the same or substantially the same shape. As shown, each traces a corresponding square shape that circumscribes the SiC half-bridge module 202, but other shapes could be implemented. This symmetry can minimize the loop inductance of the DC bus. The positive DC bus plate 208 and negative DC bus plate 206 can also be shaped so that one nests directly adjacent to the other, with each plate 206, 208 following the contours of the other so that, apart from the terminals, the plates 206, 208 are closely, equally spaced apart or with insulated surfaces (as discussed below) touching. The plates 206, 208 can be contoured so that, when nested, the negative DC terminals 404 and positive DC terminals 402 are all in the same plane. Referring to FIG. 4 the positive plate nests inside of and adjacent to the negative plate. Each plate can have insulated portions, such that the plates can be in physical contact without electrically conducting between them. The insulation can be a powder coating, for example, Interpon 100 or other suitable coating. The center tap 210 can similarly be configured to nest directly adjacent the negative DC bus plate 206 and the positive DC bus plate 208, with insulated surfaces touching or closely, equally spaced from one of the plates (here, the negative DC bus plate 206) The center tap 210 can also, with the exception of its terminals, have an electrical conductive path that is, at least partially, the same shape as the plates 206, 208. Here, the center tap 210 traces the bottom of the square shape of the plates 206, 208, but other shapes could be implemented. Likewise, when nested, the center tap 210 can have its terminals in the same plane as the positive DC terminals 402 and/or negative DC terminals 404. In certain instances, one or both of the plates 206, 208 and/or the center tap 210 can be monolithic, formed of a single piece of material.

The nesting configuration of plates of opposite polarity maximizes the amount of electric flux from each plate that cancels the other. The symmetric shape, and close proximity of cancelling electric flux creates a DC bus bar assembly 114 with a low inductance. An advantage of this low inductance is there is reduced voltage overshoot during the large time rate of change of recovery current associated with switching operations of the SiC MOSFETs.

Figure 5:
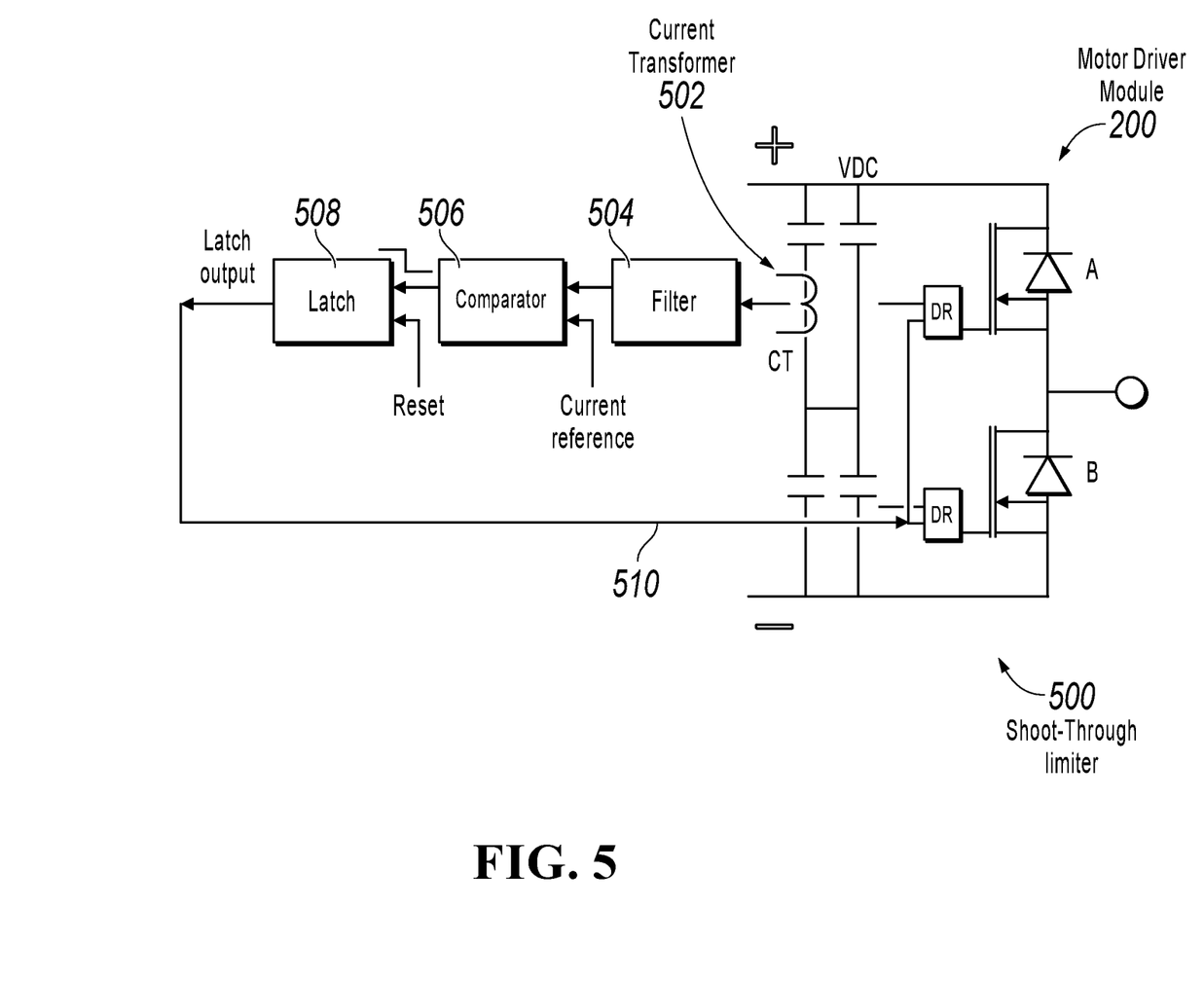
FIG. 5 depicts a simplified example independent shoot-through protection circuit for a two level bidirectional inverter.

FIG. 5 depicts a simplified independent shoot-through limiting circuit 500. The shoot-through limiting circuit 500 is independent of the gate driving circuit, and therefore can function normally in the event of a gate driver failure. The independent shoot-through limiting circuit 500 can be used in conjunction with traditional gate driver shoot-through protection such as desaturation. In another implementation, the independent shoot-through prevention circuit 500 can be the only shoot-through protection provided.

A current transformer 502 is coupled with the DC bus, and a sudden, large magnitude current, such as that caused by a shoot-through condition can generate a measurable current in the current transformer 502. While a current transformer 502 is shown in FIG. 5, any suitable current sensor that can be inductively coupled with the DC bus can be applied. The measurable current can be passed through a filter 504 which conditions the measurable current into a signal to be used to determine if a shoot-through condition exists. The filter 504 can include passive or active circuit components, and can be a low-pass, high-pass, or band-pass filter, among other things. The filter 504 can additionally include circuitry to scale or shift the measurable current in order to protect downstream circuitry. The conditioned signal can then pass from the filter 504 to a comparator 506.

The comparator 506 will output a high voltage associated with a logical false (e.g., 3.3V, 5V) when the conditioned signal is below a reference current, and a low voltage associated with a logical true (e.g., 0, −3.3V, −5V) when the conditioned signal is above a reference current. The comparator output is supplied to a latch 508, which can interrupt the gate signals upon receiving a high to low transitional voltage input. With the gate signals interrupted the SiC MOSFETS will switch to a non-conducting state, and the shoot-through condition will be stopped. A reset switch on the latch 508 can be provided, which enables the independent shoot-through prevention circuit 500 to stop interrupting gate signals, and allow the two level inverter 102 to restart operation.

By using largely analog circuitry, or simple logic integrated circuits, the independent shoot-through limiting circuit 500 can respond nearly instantaneously to a shoot-through condition, removing the need for low latency digital circuitry, or high sample rate systems.

Figure 6:
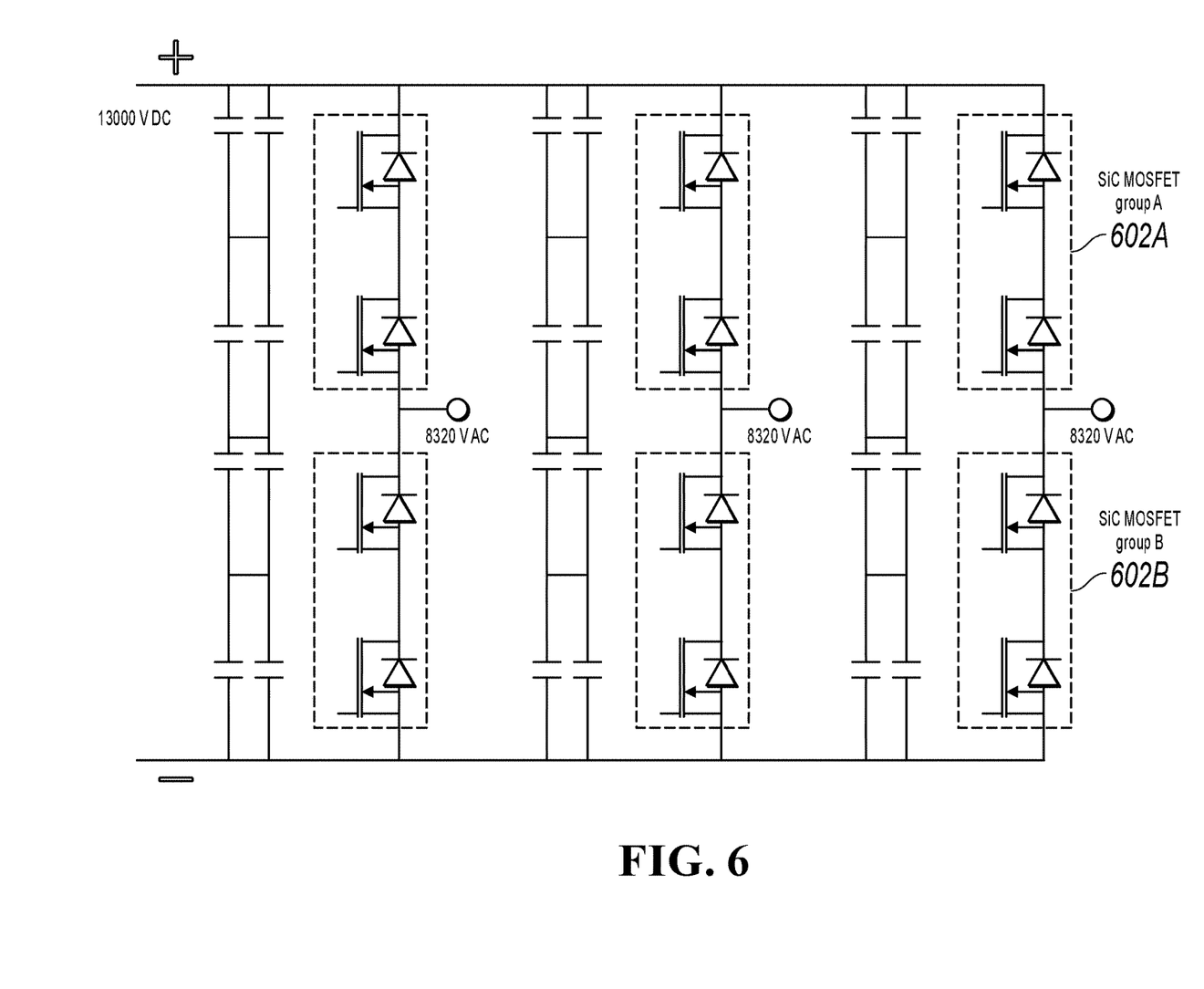
FIG. 6 depicts a simplified example schematic of a 2MW inverter using two level bidirectional inverter modules.

FIG. 6 depicts simplified example schematic of a 2MW inverter using two level bidirectional inverter modules. In this implementation SiC MOSFETs are used in series, to allow for a higher drain to source voltage across each side of the two-level inverter. In this case, each SiC half-bridge module, which can be, for example, the SiC half-bridge module 202 as described with reference to FIG. 2, has one or more pairs of series SiC MOSFETs that can be gated simultaneously. In this configurations SiC MOSFET group A (602 A) can behave like a single SiC MOSFET with a voltage rating that is approximately double the voltage rating of an individual SiC MOSFET. Similarly SiC MOSFET group B (602B) can behave like a second SiC MOSFET with a similar voltage rating. As shown in this example implementation, six SiC half-bridge modules can be used to allow for energy conversion between 13 kV DC and 8320V AC, with three phases, each providing approximately 667 kW of power, for a total of approximately 2 MW. It should be noted that the capacitors in this schematics are for clarity of presentation, and would preferably be configured similar to the capacitors in FIG. 2, with a low inductance DC bus bar similar to that described in FIG. 4 straddling each SiC half-bridge module.

The foregoing description is provided in the context of one or more particular implementations. Various modifications, alterations, and permutations of the disclosed implementations can be made without departing from scope of the disclosure. Thus, the present disclosure is not intended to be limited only to the described or illustrated implementations, but is to be accorded the widest scope consistent with the principles and features disclosed herein.

The invention claimed is:

1. A bidirectional, two level inverter for a motor and/or generator, comprising:
    a silicon carbide (SiC) half-bridge module, the SiC half-bridge module comprising:
        two or more SiC metal-oxide-semiconductor field-effect transistors (MOSFETs) connected in series, wherein each SiC MOSFET has a gate terminal;
        an alternating current (AC) motor and/or generator terminal connected between the SiC MOSFETs; and
        a direct current (DC) bus connected across the two or more SiC MOSFETs, wherein the DC bus comprises:
            a positive conducting plate that forms a first conductive path;
            a negative conducting plate that forms a second conducting path, wherein the positive conducting plate and the negative conducting plate are shaped to nest together with the first and second conducting paths adjacent to each other; and
    a capacitor connected across the DC bus and in parallel with the SiC half-bridge module.

2. The inverter of claim 1, wherein the DC bus voltage is at least 3,000V, and wherein each SiC MOSFET comprises a drain terminal and a source terminal and are rated for a drain to source voltage of at least 10,000V.

3. The inverter of claim 1, wherein the SiC MOSFETs are configured to receive gating signals at each gate terminal in excess of 5 kHz, and wherein the SiC MOSFETs are configured to switch between an on state and an off state at a rate in excess of 5 kHz.

4. The inverter of claim 1, wherein the DC bus comprises:
    a positive conducting plate that forms a first conductive path, and a negative conducting plate that forms a second conducting path, wherein a portion of the each conducting plate is covered with an insulated coating, wherein the first and second conductive paths are the same shape.

5. The inverter of claim 4, wherein the insulated coating is a powder coating.

6. The inverter of claim 1, further comprising:
    a shoot-through protective circuit comprising:
        a current sensor inductively coupled to at least one capacitor in the capacitor bank configured to provide an output signal proportional to a capacitor current;
        a comparator, configured to compare the output signal with a reference current; and
        a latch, configured to interrupt gating signals and place the SiC MOSFETs in an off state.

7. The inverter of claim 1, further comprising a capacitor bank, wherein the capacitor bank comprises the capacitor, wherein the capacitor bank is connected across the DC bus and in parallel with the SiC half-bridge module, and wherein the capacitor bank comprises:
    a first set of two or more capacitors connected in series, having a positive end, a negative end, and an intermediate node;
    a second set of two or more capacitors connected in series, having a positive end, a negative end, and an intermediate node; and
    a center tap connecting the intermediate nodes of the first and second sets of two or more capacitors.

8. The inverter of claim 7, wherein at least one SiC half-bridge module is positioned between the first set of at least two capacitors connected in series and the second set of at least two capacitors connected in series.

9. A bidirectional, two level inverter for a motor and/or generator, comprising:
    a silicon carbide (SiC) half-bridge module, the SiC half-bridge module comprising:
        two or more SiC metal-oxide-semiconductor field-effect transistors (MOSFETs) connected in series, wherein each SiC MOSFET has a gate terminal;
        an alternating current (AC) motor and/or generator terminal connected between the SiC MOSFETs; and
        a direct current (DC) bus connected across the two or more SiC MOSFETs;
    a capacitor connected across the DC bus and in parallel with the SiC half-bridge module; and
    a shoot-through protective circuit comprising:

a current sensor inductively coupled to at least one capacitor in the capacitor bank configured to provide an output signal proportional to a capacitor current;

a comparator, configured to compare the output signal with a reference current; and a latch, configured to interrupt gating signals and place the SiC MOSFETs in an off state.

10. The inverter of claim 9, wherein the DC bus voltage is at least 3,000V, and wherein each SiC MOSFET comprises a drain terminal and a source terminal and are rated for a drain to source voltage of at least 10,000V.

11. The inverter of claim 9, wherein the SiC MOSFETs are configured to receive gating signals at each gate terminal in excess of 5 kHz, and wherein the SiC MOSFETs are configured to switch between an on state and an off state at a rate in excess of 5 kHz.

12. The inverter of claim 9, wherein the DC bus comprises:

a positive conducting plate that forms a first conductive path, and a negative conducting plate that forms a second conducting path, wherein a portion of the each conducting plate is covered with an insulated coating, wherein the first and second conductive paths are the same shape.

13. The inverter of claim 12, wherein the insulated coating is a powder coating.

14. The inverter of claim 9, wherein the DC bus comprises:

a positive conducting plate that forms a first conductive path, and a negative conducting plate that forms a second conducting path; and where the positive conducting plate and the negative conducting plate are shaped to nest together with the first and second conducting paths adjacent to each other.

15. The inverter of claim 9, further comprising a capacitor bank, wherein the capacitor bank comprises the capacitor, wherein the capacitor bank is connected across the DC bus and in parallel with the SiC half-bridge module, and wherein the capacitor bank comprises:

a first set of two or more capacitors connected in series, having a positive end, a negative end, and an intermediate node;

a second set of two or more capacitors connected in series, having a positive end, a negative end, and an intermediate node; and a center tap connecting the intermediate nodes of the first and second sets of two or more capacitors.

16. A bidirectional, two level inverter for a motor and/or generator, comprising:

a silicon carbide (SiC) half-bridge module, the SiC half-bridge module comprising:

two or more SiC metal-oxide-semiconductor field-effect transistors (MOSFETs) connected in series, wherein each SiC MOSFET has a gate terminal;

an alternating current (AC) motor and/or generator terminal connected between the SiC MOSFETs; and a direct current (DC) bus connected across the two or more SiC MOSFETs; and a capacitor bank connected across the DC bus and in parallel with the SiC half-bridge module, the capacitor bank comprising:

a first set of two or more capacitors connected in series, having a positive end, a negative end, and an intermediate node;

a second set of two or more capacitors connected in series, having a positive end, a negative end, and an intermediate node; and a center tap connecting the intermediate nodes of the first and second sets of two or more capacitors.

17. The inverter of claim 16, wherein the DC bus voltage is at least 3,000V, and wherein each SiC MOSFET comprises a drain terminal and a source terminal and are rated for a drain to source voltage of at least 10,000V.

18. The inverter of claim 16, wherein the SiC MOSFETs are configured to receive gating signals at each gate terminal in excess of 5 kHz, and wherein the SiC MOSFETs are configured to switch between an on state and an off state at a rate in excess of 5 kHz.

19. The inverter of claim 16, wherein the DC bus comprises:

a positive conducting plate that forms a first conductive path, and a negative conducting plate that forms a second conducting path, wherein a portion of the each conducting plate is covered with an insulated coating, wherein the first and second conductive paths are the same shape.

20. The inverter of claim 16, wherein at least one SiC half-bridge module is positioned between the first set of at least two capacitors connected in series and the second set of at least two capacitors connected in series.

* * * * *